United States Patent [19]

Schmitt et al.

[11] 4,212,031

[45] Jul. 8, 1980

[54] METHOD OF ALIGNING A BODY

[75] Inventors: Alfons Schmitt, Talheim; Diether Utz, Öhringen; Klaus Schäfer, Heilbronn, all of Fed. Rep. of Germany

[73] Assignee: Licentia Patent-Verwaltungs-G.m.b.H., Frankfurt am Main, Fed. Rep. of Germany

[21] Appl. No.: 837,890

[22] Filed: Sep. 29, 1977

[30] Foreign Application Priority Data

Sep. 29, 1976 [DE] Fed. Rep. of Germany ....... 2643809

[51] Int. Cl.² ............................................. G05D 3/00
[52] U.S. Cl. .................................. 358/101; 318/652; 364/474
[58] Field of Search ........................ 358/101; 364/474; 318/652

[56] References Cited

U.S. PATENT DOCUMENTS

| | | | |
|---|---|---|---|
| 3,693,154 | 9/1972 | Kubo | 358/101 |
| 3,887,762 | 6/1975 | Uno | 358/101 |
| 3,899,634 | 8/1975 | Montone | 358/101 |
| 3,903,363 | 9/1975 | Montone | 358/101 |
| 3,986,007 | 10/1976 | Ruoff | 358/101 |
| 3,988,535 | 10/1976 | Hickman | 358/101 |

*Primary Examiner*—Howard W. Britton
*Attorney, Agent, or Firm*—Spencer & Kaye

[57] ABSTRACT

A method of aligning a body in a desired position comprises producing an image from the body which is then broken down into image points with a spacing smaller than the required accuracy, storing the information content of the image points in digital form, comparing the stored information with desired information and moving the body accordingly.

15 Claims, 4 Drawing Figures

METHOD OF ALIGNING A BODY

BACKGROUND OF THE INVENTION

The invention relates to a method of aligning a body at a desired position. This type of method of alignment is necessary, for example, in semiconductor technology where the semiconductor body or the structures already located thereon must be aligned with processing means or contacting means.

In a previously known method of alignment, the semiconductor body provided with structures or with aids to alignment or a semiconductor chip was aligned with the aid of micromanipulators during observation under a microscope so that the structures of the semiconductor body or the semiconductor chip having appropriate structures came into coincidence with the processing means or the contact means. In the processing means it is a question for example of photomasks or of contacting masks which are required for the manufacture of diffusion windows or of connections to simiconductors. This method of alignment take place manually and therefore is cost-intensive and time-consuming.

SUMMARY OF THE INVENTION

An object of the invention is to provide a method of alignment which may be used with bodies of any desired type to fundamentally solve most problems of alignment and which takes place fully automatically.

According to a first aspect of the invention, there is provided a method of aligning a body in a desired position comprising the steps of producing an image from said body, breaking said image down into image points whose spacing is smaller than the required accuracy, digitalising and storing the information content of said image points, comparing the stored information content with a desired information content and controlling movement of said body in response to said comparison.

According to a second aspect of the invention, there is provided a method of aligning a body in a desired position, characterized in that at least one alignment position of the body an image is produced from the actual position and this image is broken down into image points the spacing of which is smaller than the required adjustment accuracy; that the information content of these image points is digitalised and stored; that in a data processing system containing the desired position of the adjustment position also stored in digitalised form, the actual and desired position of the adjustment position are compared together and deviations are calculated; that the body to be adjusted is then displaced by the amount of the deviations with the aid of movement devices controlled by the data processing system.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
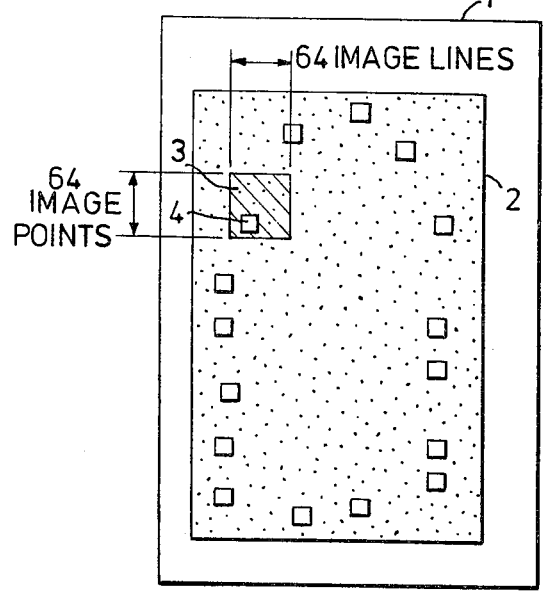
FIG. 1 is a plan view of a body showing the image field of the television camera used in an embodiment of the method in accordance with the invention.

In a preferred form of the invention, in a method of the type described at the outset an image is produced of the actual position of at least one position of alignment of the body and this image is broken down into image points, the spacing of which is smaller than the required alignment accuracy; the information content of these image points is digitalised and stored in a data processing system containing the desired position of the position of alignment also in digital form and stored, the actual and desired position of the position of alignment are compared and deviations are calculated; and the body to be aligned is then displaced by the amount of the calculated deviation with the aid of movement devices controlled by means of the data processing system.

The method in accordance with the preferred embodiment of the invention has the advantage that it takes place fully automatically and that visual observation of the alignment process is no longer absolutely necessary. With the method described, each of the bodies to be aligned may be brought into a desired and predetermined desired position. This desired position may be predetermined for example by the defined position of processing means, with the aid of these processing means the body to be adjusted is subjected to further processes. These processing means may for example be photomasks or connection contact strips when using the method of alignment proposed in semiconductor technology.

A television image is preferably produced of the body to be aligned in which only the portion of the image which contains the alignment position of this television image must be digitalised and stored away. The portion of the image must be selected to be so large that when taking into account the accuracy of feed of the body to be aligned into the alignment system, the alignment position lies safely within the stated image portion. Thus a structure of the body to be aligned must appear in the image portion, the desired position of the structure being stored away in the data processing system. The actual position appearing in the image portion is compared with the desired position with the aid of the new method and the deviations determined during this comparison are calculated by the data processing system and thereafter are converted into an appropriate displacement of the body to be aligned.

The television image of the body to be aligned may be reproduced with the aid of a monitor for visual control, which, however, is not absolutely necessary. The image portion to be digitalised and stored away is preferably reproduced brighter within this television image so that any observer is always able to establish whether the structure of the body to be aligned, used as an aid to alignment, lies within the image portion. This makes it possible to control the accuracy of feed of the body to be aligned in the alignment system.

A television image comprises two image halves, in which the first image half only contains the odd number of lines of the television image while in the second image half the even numbers of lines are reproduced. It has been proved that, in order to carry out the method in accordance with the invention, it is sufficient if only the image portion from one of the two image halves of the television image is digitalised. In this way the method of alignment may be accelerated, since it is not necessary to wait for scanning of the second image half.

In the method in accordance with the invention, provision is made for the line pulses and the starting pulses for the image halves to be filtered out from the pulses emitted by the television camera and for the line pulses after the starting pulse for the predetermined image half to be passed to a line counter. This line counter only triggers storage of a part of the image points of a predetermined number of successive lines from a number of lines predetermined by a preselector switch onwards. This is necessary because only the lines of the television image falling into the image portion are to be interrogated. The lines of the image thus selected of which only a part must be stored away are broken down into image points with the aid of a clock pulse generator. An image point counter is connected after the clock pulse generator, said counter only triggering storing away of a predetermined number of successive image points after a number of image points of each line predetermined in turn by a preselector switch. This counting off of the image points is necessary because only the image points falling into the image portion are to be digitalised and stored away.

In order to be able to store away the information content of the image points, a binary quantity must be assigned to the respective brilliance value of each image point. This takes place by an image point being declared as "black" up to a certain brightness and being provided with one binary quantity, while an image point, the brightness of which exceeds the threshold value selected counts as "white" and is provided with the other binary quantity. Thus during the scanning time of the image portion, the image signal is passed to a comparator in which the voltage corresponding to the image brightness is compared to a comparison voltage which corresponds to the threshold value such that, when the comparison voltage is fallen below, the information content of the image corresponds to one binary value and, when the comparison voltage is exceeded, the information content of the image point corresponds to the other binary value "0" or "1". The digitalised information content of the image points of an image line to be stored, which content corresponds to a "black/white instruction", is registered in a shift register having an appropriate number of positions. After storing away the image points of each line, the information content of the shift register is then transmitted to a computer, the shift register comprising a series of "0" and "1" values. After transmitting the image points of all the image lines to be stored, the overall content of the actual image is compared in the computer with the overall desired image also stored. With the aid of a program to be fed into the computer, the deviations between the actual image and the desired image are now calculated and these deviations are converted into an appropriate displacement of the bodies to be aligned.

Of the overall image recorded by the television camera, two image portions of the body to be aligned which are as remote as possible from each other are digitalised and stored away in order to establish angular deviations of the actual position from the desired position, wherein, of course, a structure capable of alignment must be contained in each image portion. From the comparison of the actual positions of both position alignments with the two desired positions stored in the data processing system, angular deviations are calculated in the computer and these are converted into a rotary movement of the body to be aligned. If two image portions from the overall television image are digitalised and stored, it is advantageous to take one image portion from the first image half of the television image and to take, digitalise, and store away the other image portion from the following second image half of the television image.

The alignment of a semiconductor body or the structure located on a semiconductor body with a desired position will now be described as an example. In the structure on the semiconductor body, which is used for adjustment, it is a question, for example, of a metal contact which must be brought into a desired position for automatic adjustment, in which the contacting finger of a frame-like contacting strip is located for example.

By means of appropriate illumination of the semiconductor body it is possible for this connection spot to be made to stand out very clearly from its surroundings. If for example the surroundings are light and the connection contact is dark then it is sufficient to compare the image content of the television signal with a "black-white threshold" for the purpose of digitalisation of the image.

In order to produce the television image, a commercially used industrial television camera having 875 lines per image is used, for example, said camera detecting the image of the semiconductor component to be aligned by means of an optical system having the desired enlargement. Since the edge length of semiconductor components or integrated circuits only amounts to a few millimeters the enlargement of the optical system is set for example so that 200 image lines of an image region cover 1 mm width. In FIG. 1 the overall image 1 is shown this being detected by the television camera. This overall image contains an integrated semiconductor circuit 2 for example which has numerous connection contacts 4 on its formed surface. It is sufficient if one of these connection points 4 is brought into a predetermined desired position with the aid of an appropriate adjustment system. If this adjustment takes place with sufficient accuracy, all remaining connection points are brought by it into the required position. With the technical auxiliary means in common use today, it is possible to bring a semiconductor component or an integrated circuit having a feed accuracy of approximately $\pm 100$ $\mu$m into a desired position. This accuracy is not sufficient however in order to connect the connection contacts of the semiconductor chip fully automatically, for example, to contacting limbs. Thus an accuracy of approximately $\pm 10$ $\mu$m is necessary and this may be maintained when using the adjustment method in accordance with the invention.

In order to be able to carry out as rapidly as possible the breakdown of the image, only one image half of the television image is evaluated for adjustment. With a television system having 875 lines per image the image half thus contains 437 lines of which 410 lines may be utilized for the image content of the entire image. If it is assumed that the co-ordinate controls connected thereafter by means of which the semiconductor body is displaced, have an accuracy of $\pm 5$ $\mu$m then the resolution of the image lines is also at $\pm 5$ $\mu$m if the required adjustment accuracy has a magnitude of $\pm 10$ $\mu$m. From this it is apparent that the line spacing of the image lines detected must be approximately 5 $\mu$m. With the stated supply accuracy of the semiconductor body as a result of the mechanics of the adjustment systems of ±100 μm and a magnitude of the contacting area 4 to be detected of 100×100 μm the image window 3 to be scanned must have a minimum size of 300×300 μm, so that the adjustment structure 4 lies safely within the image window 3 to be scanned. With a line spacing of 5 μm the image window 3 contains 60 lines to be scanned in a vertical direction. The overall image size is 410 lines at a spacing of 5 μm and an image ratio of 4:3, 2.73×2.05 mm. The optical system for image detection must therefore be selected so that an image of this size is reproduced by the television camera. Each image line must be broken down into image points which also have a spacing of 5 μm from each other. In order to scan a line 35.5 μs are available, this corresponds to an image forming line length of 2.73 mm. This means that each image line is broken down into 546 image points. The spacing of two image points is then 65 ns. 60 image points of the total 546 image points fall into the region of the image window 3, if the image window has a width of 300 μm. Since many data processing systems have a word width of 16 bits a size of 64 lines×64 image points was selected for the image portion 3 and this corresponds to an adjustment region of 320×320 μm.

In order to be able to detect any desired connection point 4 of the semiconductor body the image window 3 to be scanned may be brought electronically to any desired position of the image. The image window is made visible by means of lightening the image on the monitor.

Figure 2:
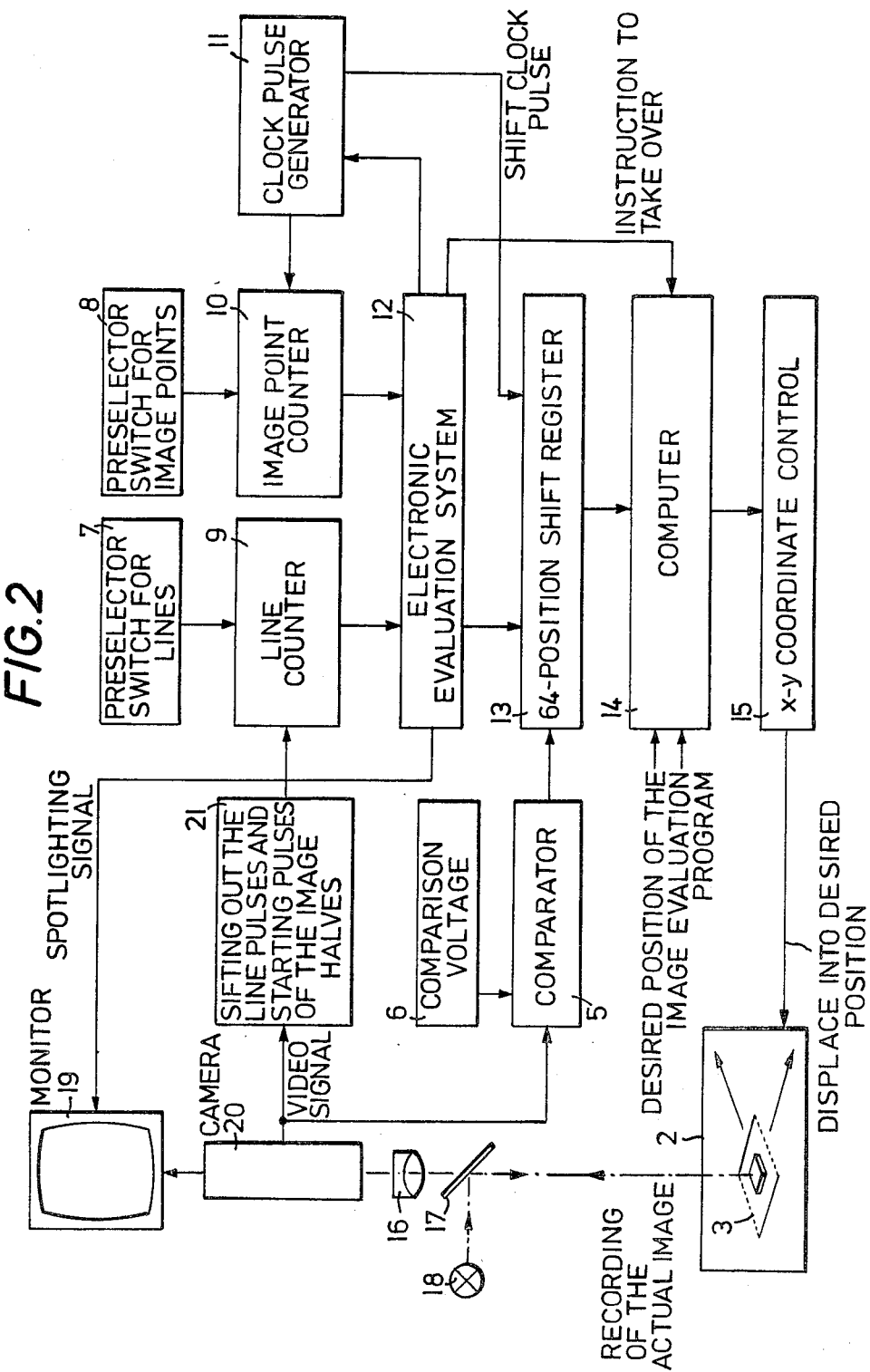
FIG. 2 is a block diagram of the adjustment system used in the method.

The block circuit diagram of the adjustment system in accordance with the invention is shown in FIG. 2. The commercially available television camera 20 having 875 lines per image detects the image of the semiconductor component 2 to be aligned by means of its optical system 16. For the reasons already described the enlargement of the optical system 16 is selected so that the spacing between two lines is 5 μm. As a result of direct illumination 18 via a semitransmissive mirror 17, the semiconductor component 2 is illuminated so that a picture is formed which is as rich in contrast as possible. The connection points 4 (FIG. 1) appear to be deep black in relation to the semiconductor surface surrounding them. The video signal of the television camera is supplied on one hand to the monitor 19 which reproduces the image of the semiconductor body and on the other hand to an electronic system 21 which filters out of the video signal the pulse for the beginning of the second image half and the line pulses. As soon as the pulse for the beginning of the second image half appears, the following line pulses are passed to a line counter 9 which is preset to the number of lines by means of a preselector switch 7 in which the scanning of the picture is to begin in a vertical direction. The vertical position of the image portion to be scanned may be set with the preselector switch. The counter state is lowered by 1 with each line pulse reaching the line counter 9 until the position 0 is reached. A further counter then counts the 64 lines to be scanned which must be broken down into image points. After these 64 line pulses scanning is terminated in the vertical direction.

At the beginning of the first line falling into the image portion which is scanned, a 15.38 Mhz generator 11 is connected, this breaking down the lines into image points of 65 ns duration. The pulses of the clock pulse generator 11 are supplied to a counter 10 which is preset to the image point by means of a line pulse through a preselector switch 8, in which scanning is to take place in a horizontal direction. Thus the beginning of the image portion is determined in a horizontal direction by means of the preselector switch. The counter state of the image point counter 10 is lowered by 1 with each incoming image point pulse of a line until the counter state has reached 0. Then a further counter counts the 64 image points to be scanned which are to be stored away in the shift register 13. At the end of these 64 counter steps a line is scanned. The electronic system 12 for evaluation now establishes the time when the 64 image points of a line are scanned. During this time the 64-position shift register 13 is triggered for storing the image points. The shift clock pulse for the shift register is drawn from the clock pulse generator 11. During the time in which scanning of the image points takes place, the brightness of the monitor is increased slightly by the electronic evaluation system. As a result a brightly illuminated image portion is obtained corresponding to the image portion 3 (FIG. 1) which has been scanned.

During the time in which the 64 image points are scanned, the 64-position shift register 13 is triggered, as already mentioned, in order to accommodate the information content of these image points. In order to make a black-white decision for each image point, the video signal of the television camera is supplied to a comparison circuit 5 which is supplied moreover with a comparison voltage 6 which defines the threshold for the black-white decision. The comparison circuit 5 always emits a signal when the video signal exceeds the threshold value of the comparison voltage said signal corresponding to the value "black". When the threshold value is fallen below the comparator emits a signal which corresponds to the value "white". A binary quantity "0" or "1" is assigned respectively to the values "white" and "black".

During the scanning time a binary quantity is registered in the shift register every 65 ns, said quantity corresponding to the signal value arriving at this point in time respectively at the output of the comparator. After 64 counting pulses, the 64 scanned image points of the appropriate line are stored in the shift register 13. After storing the 64 image points of an image line, the computer 14 receives an instruction to take over the shift register content from the electronic evaluation system 12. This content is then transmitted into the computer 14 via the fast data channel. In this way all 64 desired lines are scanned and stored away in the computer.

If all 64 lines have been scanned this is announced to the computing system 14 by means of the electronic evaluation system 12. The computer now compares the scanned image with the desired position of the adjustment field stored in the computer in accordance with a predetermined evaluation program and calculates the deviation of the semiconductor component 1 from this desired position from the differences. The deviations determined are transmitted by the computer to an X-Y co-ordinate control 15 which contains drive motors. With their aid the semiconductor body is transported into the desired position in which the semiconductor component may then be subjected to further processing steps.

Figure 3:
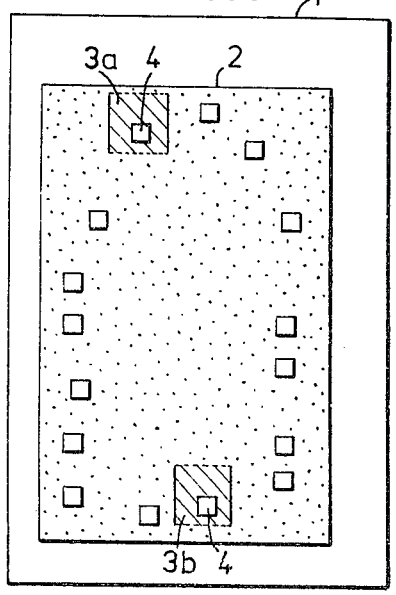
FIG. 3 is a view similar to FIG. 1 but in accordance with a modified embodiment.

If the body to be adjusted must not only be adjusted in the X-Y direction but is also to be rotated by an angle Z then the image detecting electronic system described together with FIG. 2 is used twice. In this way it is possible to detect two separate image portions of two different positions of alignment at the same time. This is shown in FIG. 3. An image portion 3a and an image portion 3b lying remote therefrom are detected, digitalised and stored away. The two actual images of the alignment structures 4 which are formed in turn for example from contact areas are compared in the data processing system with two desired images of these structures. From the comparison both the required displacement of the actual image in an X-Y direction and the required angle of rotation are calculated. The movements determined are carried out via a co-ordinate control.

Figure 4:
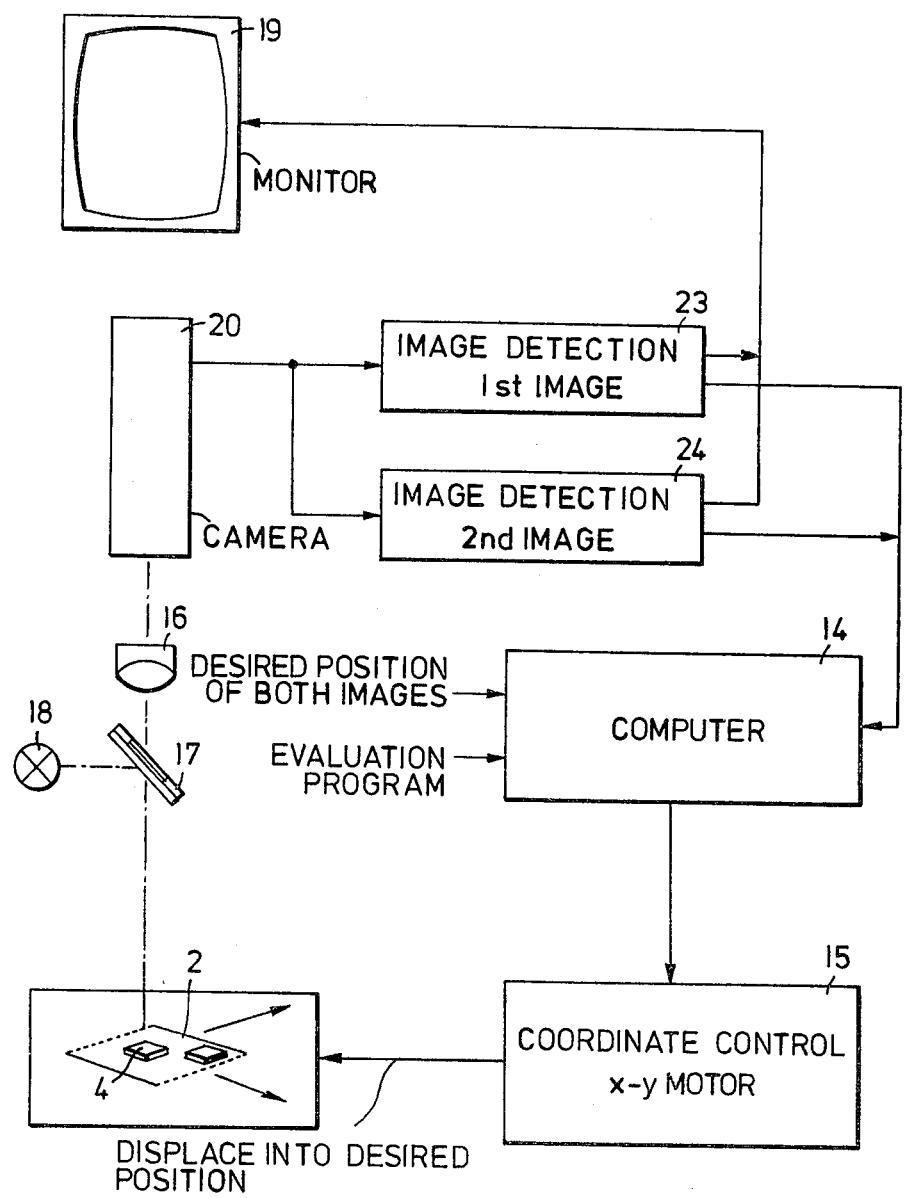
FIG. 4, is a simplified block diagram associated with the modified embodiment.

Both image portions are preferably to be seen from the same image half. A simplified block circuit diagram is shown in FIG. 4. A television camera 20 is again necessary which records an image of the semiconductor component or the integrated circuit 2 using an optical system 16, a mirror 17 and an illumination source 18 and passes this to a monitor 19 or to the two image detection systems 23 and 24. The digitalised image portions are in turn fed into a computer 16 and there they are compared with the desired positions of the two images with the aid of an appropriate evaluation program. From the deviations, the required control instructions are calculated for the co-ordinate control in an X-Y and Z-direction. The displacement of the semiconductor body or of the base carrying the semiconductor body takes place by means of appropriately driven control motors.

The method of adjustment in accordance with the invention may be used in practice for solving all problems of adjustment. The resolution ratios selected and the size of the image window must be matched to the circumstances. The proposed method of adjustment for aligning semiconductor bodies or semiconductor chips with the operating means or contact means provided for processing semiconductor components may be used in semiconductor technology.

It will be understood that the above description of the present invention is susceptible to various modification changes and adaptations.

What is claimed is:

1. A method of aligning a body in a desired position, comprising producing an image of the actual location of at least one alignment position of the body and breaking this actual location image down into image points the spacing of which is smaller than the required adjustment accuracy; digitalizing and storing the information content of these image points in a data processing system containing the desired location of the one alignment position also stored in digitalized form; comparing the actual and desired locations of the one alignment position and calculating deviations therebetween; and displacing the body by the amount of the deviations with the aid of movement devices controlled by the data processing system.

2. A method as defined in claim 1, and comprising producing a television picture of said body to be adjusted and wherein said step of digitalizing and storing is performed only on the image portion of said television picture containing the alignment position.

3. A method as defined in claim 2 and comprising reproducing said television picture for visual control with the aid of a monitor.

4. A method as defined in claim 2, and comprising making said image portion so large that when taking into account the accuracy of feed of said body to be adjusted in the adjustment system, the alignment position lies safely within the image portion.

5. A method as defined in claim 2, wherein said step of digitalizing is carried out only on the image portion of one image half of the television picture.

6. A method as defined in claim 2, wherein said step of producing a picture is performed by a raster scanning television camera and comprises filtering out line impulses and the starting pulse for one image half of the pulses emitted by the television camera and passing the line pulses which occur after the starting pulse for the predetermined image half, to a line counter which only releases a stored part of the image points of a predetermined number of successive lines for the number of lines predetermined by a preselector switch onwards.

7. A method as defined in claim 6, and comprising breaking down the image lines, of which one part is to be stored away, into image points using a clock pulse generator; and connecting an image point counter after said clock pulse generator, said image point counter only triggering storing of a predetermined number of successive image points from a number of image points of each line predetermined by a preselector switch onwards.

8. A method as defined in claim 7, wherein said step of digitalizing and storing comprises storing successive image points by passing the image signal to a comparator during the scanning time of the image portion, in which the voltage corresponding to the brightness of the image is compared to a comparison voltage so that, when the comparison voltage is fallen below, the information content of the image is reproduced as one binary value and when the comparison voltage is exceeded, the information content of the image point is reproduced by the other binary value.

9. A method as defined in claim 8, and comprising entering the digitalized information content of the image points of an image line to be stored away corresponding to a "black-white" instruction in a shift register having an appropriate number of positions; and transmitting the information content of the shift register into a computer; and wherein said step of comparing comprises, after storing away the image points of each line, comparing the overall stored content of the actual image to the overall content of the desired image, also stored, that after transmitting the image points of all the image lines to be stored in the computer, and said step of calculating comprises calculating the deviations and converting said deviations into appropriate displacement of the body to be adjusted.

10. A method as defined in claim 2 wherein said steps of producing an image and digitalizing and storing is performed on two image portions which are as remote as possible from each other and which each contain a respective alignment position in order to establish the angular deviations of the actual position of the body from the desired position thereof, and comprising determining angular deviations in a computer from a comparison of the actual locations of the two alignment positions with the desired locations of those two positions and converting these angular deviations into a rotary motion of the body.

11. A method as defined in claim 10, wherein one such image portion is taken from a first picture half of the television image and is digitalized, while the other such image portion is also taken from one of the picture halves of the television image and is also stored in digitalized form.

12. A method as defined in claim 1 for aligning a semiconductor body with processing means provided for processing semiconductor bodies.

13. A method as defined in claim 1 for aligning contact positions of semiconductor components with contacting means.

14. A method of aligning a body in a desired position comprising the steps of producing an image from said body, breaking said image down into image points whose spacing is smaller than the required accuracy, digitalizing and storing the information content of said image points, comparing the stored information content with a desired information content, and controlling movement of said body in response to said comparison.

15. A method as defined in claim 2 comprising the initial step of preliminarily positioning the body while viewing the television picture in order to bring the alignment position into the image portion of said television picture.

* * * * *